(12) United States Patent
Schober et al.

(10) Patent No.: US 6,515,403 B1
(45) Date of Patent: Feb. 4, 2003

(54) CO-FIRED PIEZO DRIVER AND METHOD OF MAKING FOR A RING LASER GYROSCOPE

(75) Inventors: Christina M. Schober, St. Anthony, MN (US); Douglas P. Mortenson, Maple Grove, MN (US); Daniel L. Sittler, Hugo, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/911,227

(22) Filed: Jul. 23, 2001

(51) Int. Cl.[7] .............................................. H01L 41/08
(52) U.S. Cl. ...................................... 310/328; 310/366
(58) Field of Search ................................. 310/328, 366

(56) References Cited

U.S. PATENT DOCUMENTS

| | | | | |
|---|---|---|---|---|
| 3,281,613 A | * | 10/1966 | Hatschek | 310/328 |
| 3,390,287 A | * | 6/1968 | Sonderegger | 310/328 |
| 3,474,268 A | * | 10/1969 | Rudnick | 310/328 |
| 4,523,121 A | * | 6/1985 | Takahashi et al. | 310/334 |
| 4,742,264 A | * | 5/1988 | Ogawa | 310/332 |
| 4,759,107 A | * | 7/1988 | Ogawa et al. | 310/328 X |
| 5,153,477 A | * | 10/1992 | Jomura et al. | 310/328 |
| 5,438,232 A | * | 8/1995 | Inoue et al. | 310/328 |
| 6,121,718 A | * | 9/2000 | Mohr, III | 310/334 |
| 6,414,418 B1 | * | 7/2002 | Heinz et al. | 310/366 |

* cited by examiner

*Primary Examiner*—Mark O. Budd
(74) *Attorney, Agent, or Firm*—Dennis C. Bremer

(57) ABSTRACT

A multi-layer PZT comprises a plurality of stacked ceramic layers. The stack of ceramic layers includes a top ceramic layer on which negative and positive contacts for electrically coupling the PZT to external circuitry are formed. The stack of ceramic layers also includes at least one negatively poled ceramic layer having a negative conductive pattern formed thereon and at least one positively poled ceramic layer having a positive conductive pattern formed thereon. The PZT also includes a negative pattern interconnect for electrically connecting the negative contact and the negative conductive pattern and a positive pattern interconnect for electrically connecting the positive contact and the positive conductive pattern. The multi-layer PZT can be fabricated using a ceramic co-firing process.

8 Claims, 5 Drawing Sheets

US 6,515,403 B1

CO-FIRED PIEZO DRIVER AND METHOD OF MAKING FOR A RING LASER GYROSCOPE

TECHNICAL FIELD

The present invention relates to path length control apparatus (PLC) for optical devices and in particular to a co-fired piezoelectric transducer that can be used in a PLC for a ring laser gyroscope and method of making the same.

BACKGROUND OF THE INVENTION

A ring laser gyroscope (RLG) is commonly used to measure the angular rotation of an object, such as an aircraft. Such a gyroscope has two counter-rotating laser light beams that move within a closed loop optical path or "ring" with the aid of successive reflections from multiple mirrors. The closed path is defined by an optical cavity that is interior to a gyroscope frame or "block." In one type of RLG, the block includes planar top and bottom surfaces that are bordered by six planar sides that form a hexagon-shaped perimeter. Three planar non-adjacent sides of the block form the mirror mounting surfaces for three mirrors at the corners of the optical path, which is triangular in shape.

Operationally, upon rotation of the RLG about its input axis (which is perpendicular to and at the center of the planar top and bottom surfaces of the block), the effective path length of each counter-rotating laser light beam changes and a frequency differential is produced between the beams that is nominally proportional to angular rotation. This differential is then optically detected and measured by signal processing electronics to determine the angular rotation of the vehicle. To maximize the signal out of the RLG, the path length of the counter-rotating laser light beams within the cavity must be adjusted. Thus, RLGs typically include a path length control apparatus (PLC), the purpose of which is to control the path length for the counter-rotating laser light beams for maximum signal.

One such known PLC 10 for a block 12 of a RLG 14 is illustrated in FIGS. 1–2. The PLC 10 includes a piezoelectric transducer (PZT) 16 which is secured to a mirror 18 via an epoxy-based adhesive 20. The epoxy adhesive 20 completely covers the interface (defined by a lower surface 22 of the PZT 16 and an upper surface 24 of the mirror 18) between the PZT 16 and the mirror 18. The mirror 18 is secured to a mirror mounting surface 26 of the optical block 12. The mirror 18 communicates with laser bores 32 (only partially shown) of an optical cavity 34 (only partially shown) of the block 12. The bores 32 partially form a portion of the closed loop optical path 38 defined by the optical cavity 34. As seen in FIG. 1, the mirror 18 reflects counter-rotating laser light beams 40 at its respective corner of the closed loop optical path 38.

Conventional PZT 16 (perhaps shown best in FIG. 2) is defined by a pair of piezoelectric elements 42 and 44. A conductive tab 45 is sandwiched between the elements 42 and 44, which are bonded to the conductive tab 45 by thin layers of conductive epoxy. Opposite polarity conductive tabs 41 and 43 are adhered to the outer major surfaces of elements 42 and 44, respectively, also by thin layers of conductive epoxy. The opposite polarity leads 47 and 49 extend from the positive conductive tabs 41 and 43, respectively. Another lead 48 extends from the negative conductive tab 45. As shown in FIG. 1, the opposite polarity leads 47 and 49 are electrically connected to form a single lead 46, and the leads 46 and 48 extend from the PZT 16 and are connected to terminals 50 and 52 of a wireboard element 54. Leads 58 and 59 extend from the terminals 50 and 52, respectively, of the wireboard element 54 and are coupled to a regulated voltage source (not shown) which is in turn coupled to a detector (not shown) which monitors the intensity of the light beams 40. The PZT 16 takes an applied voltage delivered by the regulated voltage source, in response to a signal provided by the detector, and turns this voltage into small but precisely controlled mechanical movement. This mechanical movement of the PZT 16 affects translational movement (as represented by double-headed arrow 60) of the mirror 18, and thereby controls the laser light beam path length.

SUMMARY OF THE INVENTION

The present invention is a multi-layer PZT fabricated as a multi-layer ceramic assembly. The multi-layer PZT of the present invention has contacts, which are electrically connected to other layers within the multi-layer PZT, formed directly on the top layer of the PZT, and the regulated voltage source can be coupled directly to the PZT at the top layer contacts. The present invention is a multi-layer piezoelectric transducer that can be used as a path length control apparatus of an optical device. The multi-layer piezoelectric transducer includes a plurality of ceramic layers so as to form a stack, wherein each ceramic layer has first and second opposing surfaces. The plurality of ceramic layers includes a top layer at a first end of the stack having a top conductive pattern formed on the first surface thereof. The top conductive pattern includes a negative contact and a positive contact. The plurality of ceramic layers also includes at least one poled ceramic layer having a conductive pattern formed on the first surface thereof. The plurality of ceramic layers include additional poled ceramic layers having alternating conductive patterns formed on the first surface thereof.

DETAILED DESCRIPTION OF THE INVENTION

Figure 1:
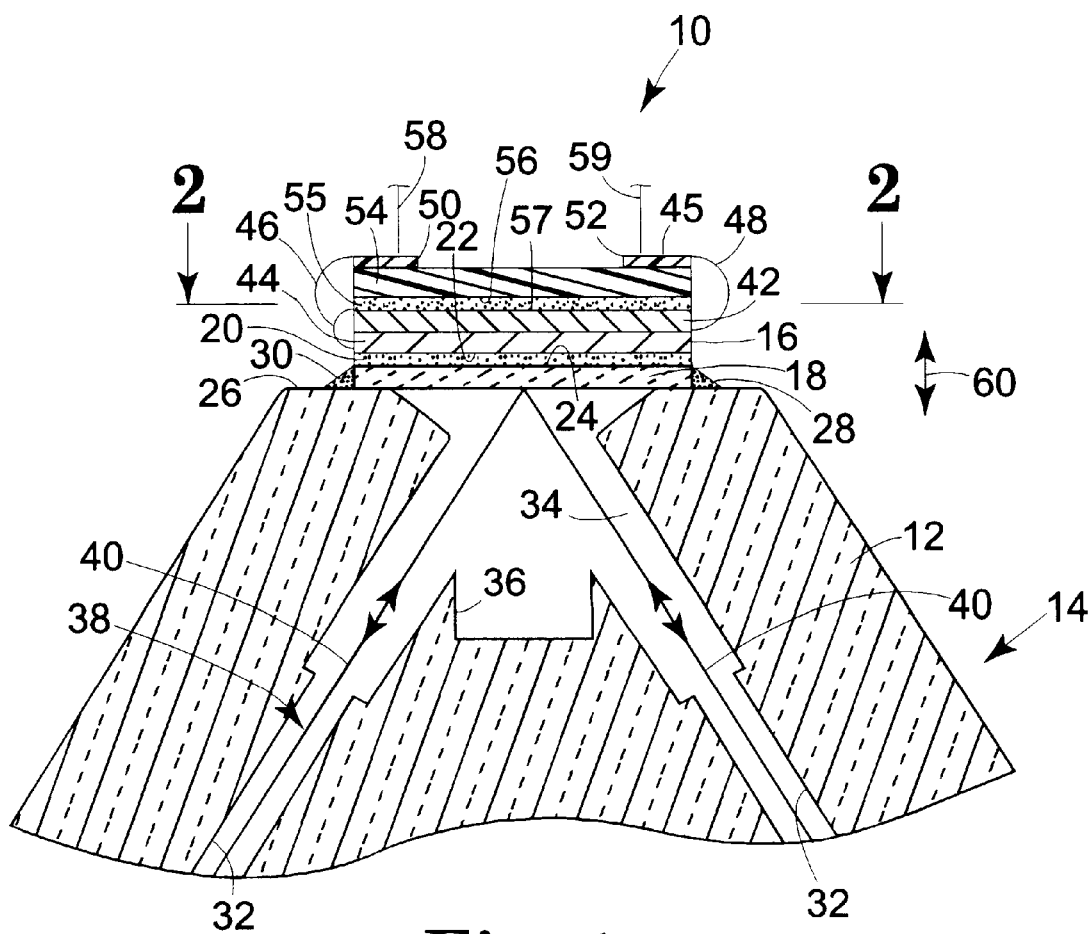
FIG. 1 is a sectional view of a portion of a prior art path length control apparatus for a ring laser gyroscope incorporating a prior art piezoelectric transducer.
Figure 2:
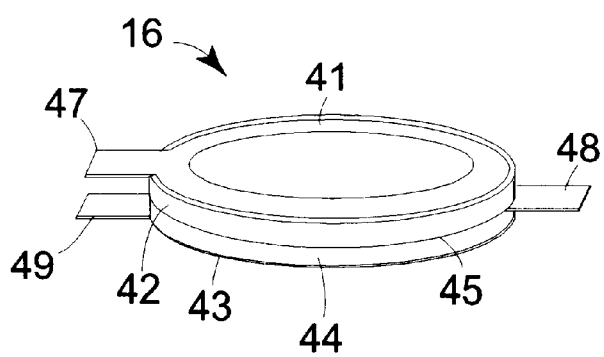
FIG. 2 is an isometric view of the prior art piezoelectric transducer shown in FIG. 1.
Figure 3:
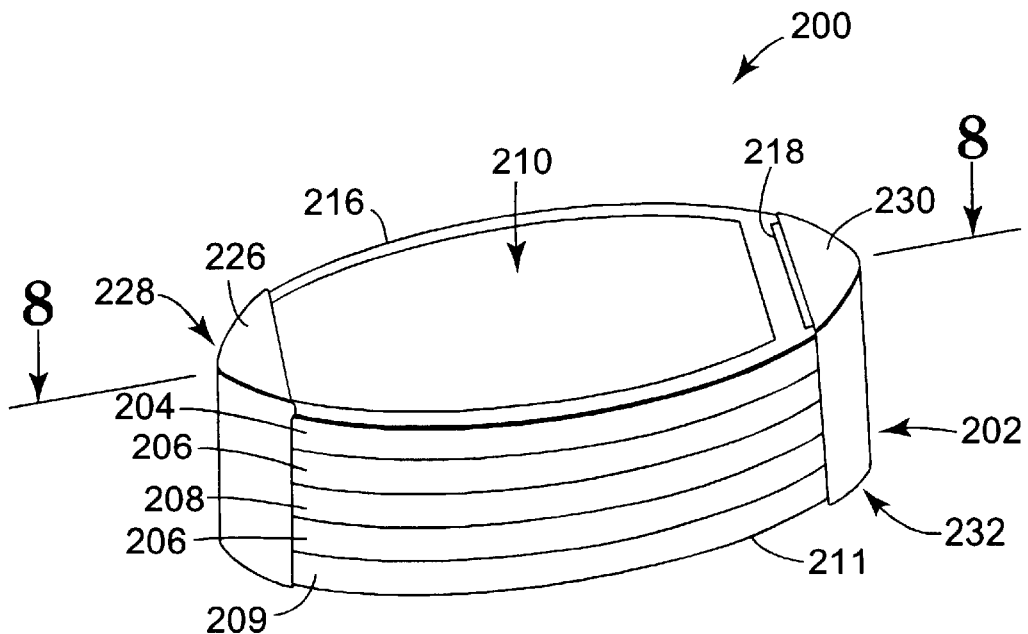
FIG. 3 is an isometric view of a second embodiment of a multi-layer piezoelectric transducer according to the present invention.
Figure 4:
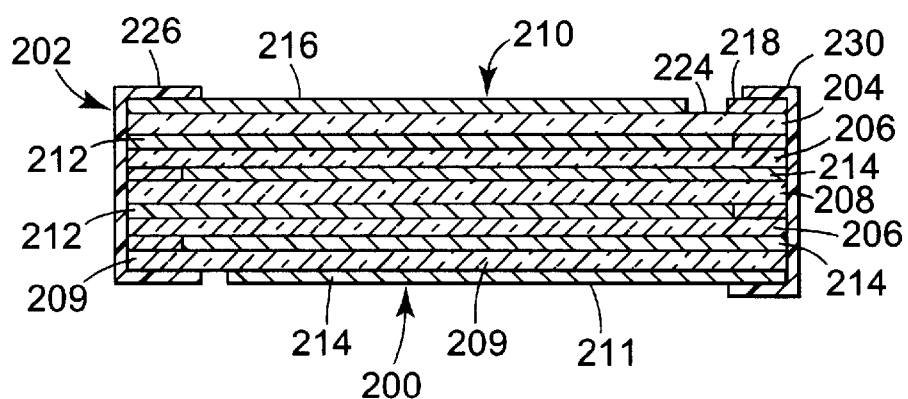
FIG. 4 is a cross-sectional view of the multi-layer piezoelectric transducer of FIG. 3 taken along the line 8—8.

A multi-layer PZT 200 is shown in FIGS. 3–4 and can be used as a path length control apparatus of an optical device. PZT 200 comprises a stack 202 of circular ceramic layers that includes a top ceramic layer 204 at a first end of the stack 202 and alternating negative ceramic layers 206 and positive ceramic layers 208. At the second end of the stack 202 opposite the first end is a bottom ceramic layer 209, which, as described below, may be a negative ceramic layer, a positive ceramic layer, or a substantially unpoled ceramic layer. Although the PZT 200 is shown in FIGS. 3–4 as having two negative ceramic layers 206 and one positive ceramic layers 208, it is to be understood that the PZT 200 can be fabricated with any number of negative ceramic layers 206 and positive ceramic layers 208. The ceramic layers of the stack 202 typically have dimensions that are similar to the dimensions of the ceramic layers of PZT 100 described above.

Figure 5:
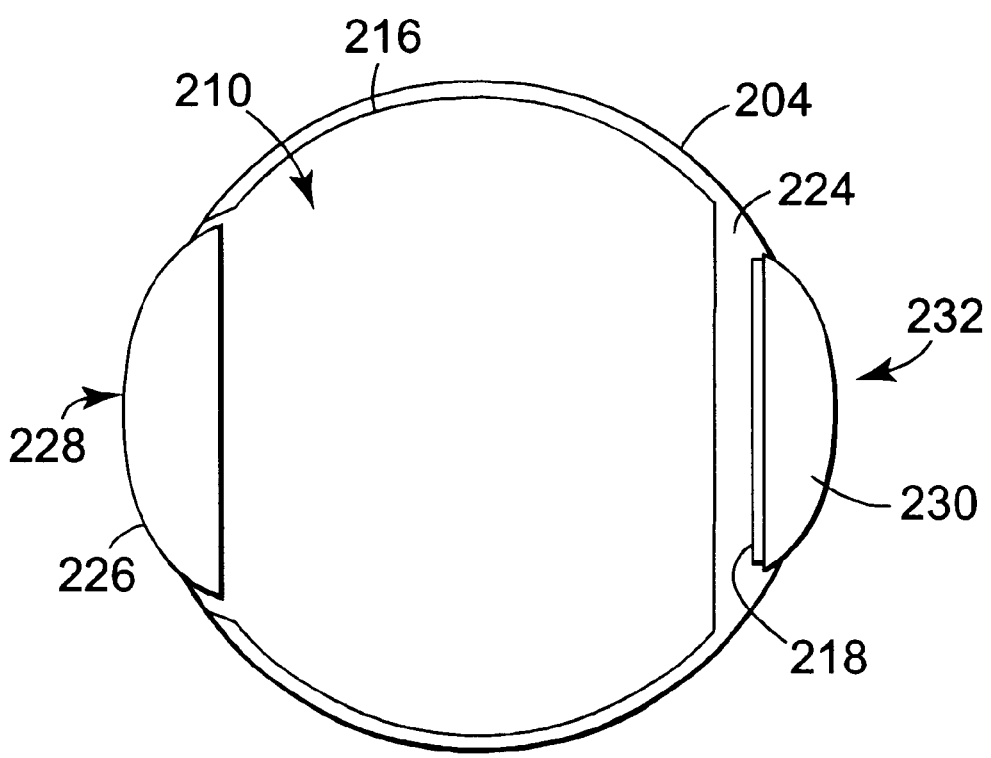
FIG. 5 is a top, plan view of the top conductive pattern of the multi-layer piezoelectric transducer of FIG. 3.

The top ceramic layer 204 has a top conductive pattern 210 (perhaps shown best in FIG. 5) formed on an upper surface thereof, each negative ceramic layer 206 has a negative conductive pattern 212 (shown in FIG. 6) formed on an upper surface thereof, and each positive ceramic layer 208 has a positive conductive pattern 214 (shown in FIG. 7) formed on an upper surface thereof. As explained in detail below, the bottom ceramic layer 209 has either a negative conductive pattern 212 or a positive conductive pattern 214 formed on an upper surface thereof.

Negative castilation 226 that covers the side of the stack 202 is formed nearside edge 228. A negative contact 216 (described below) that is formed in the top conductive pattern 210, the negative conductive patterns 212, and the negative castilation 226 are shaped and located so that the negative castilation 226 intercontacts the negative contact 216 of the top conductive pattern 210 and each of the negative conductive patterns 212. Positive castilation 230 that connects to each layer of the stack 202 are formed on a second side edge 232. A positive contact 218 (described below) that is formed in the top conductive pattern 210, the positive conductive patterns 214, and the positive castilation 230 are shaped and located so that the positive castilation 230 interconnects the positive contact 218 of the top conductive pattern 210 and each of the positive conductive patterns 214.

The top conductive pattern 210 (perhaps shown best in FIG. 5) includes a negative contact 216 and a positive contact 218. In the embodiment shown, the negative contact 216 has a generally semicircular shape with the circular periphery near the first side edge 228. The positive contact 218 is generally cresent-shaped. The negative contact 216 and the positive contact 218 are separated and electrically isolated from each other by a channel 224 formed in the top conductive pattern 210 in which no conductive material is applied. The negative and positive contacts 216 and 218 serve as terminals to which a regulated voltage source (not shown) of an optical device such as a RLG can be coupled to the PZT 200.

Figure 6:
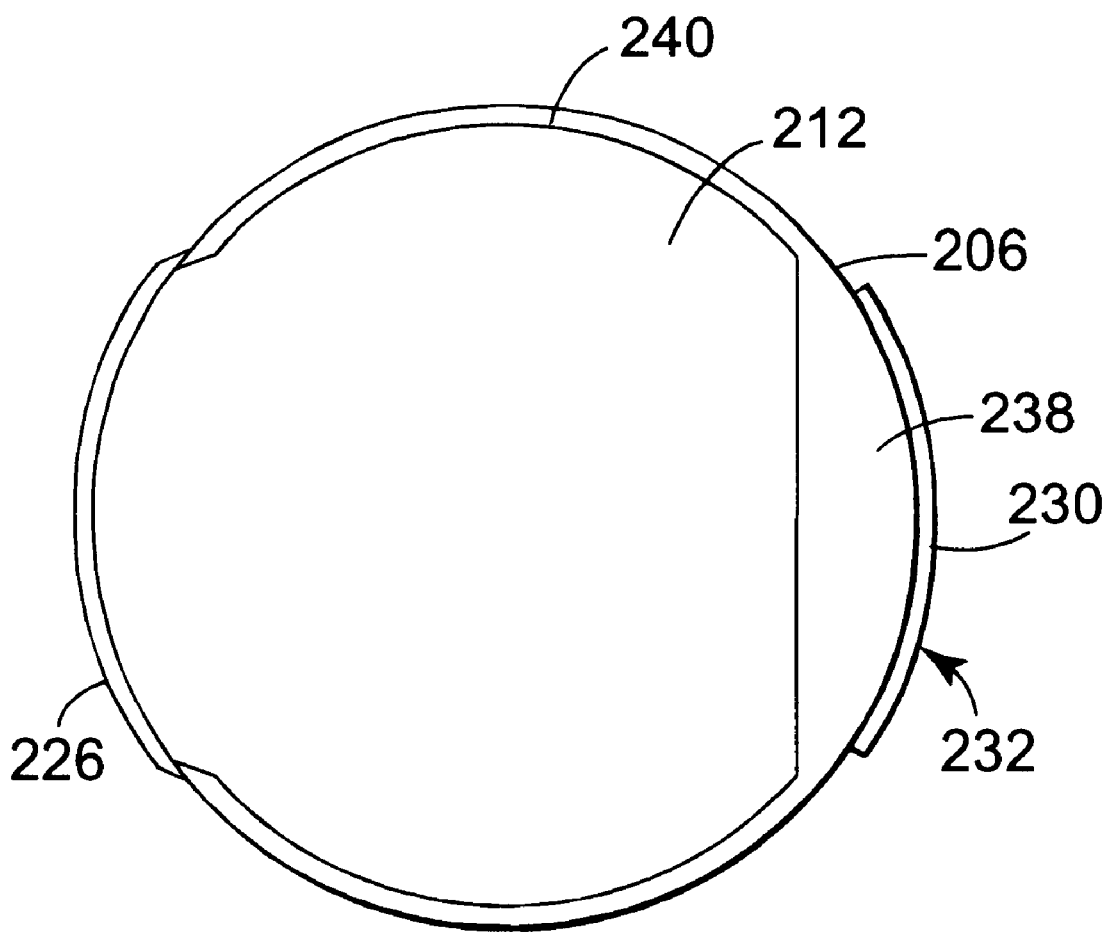
FIG. 6 is a top, plan view of the negative conductive pattern of the multi-layer piezoelectric transducer of FIG. 3.

The negative conductive pattern 212, shown in FIG. 6, is generally circular except for a crescent-shaped cutout portion 238 near the second side edge 232 in which no conductive material is present. The negative castilation 226 connects to the negative conductive pattern 212 so that the conductive coatings of the negative pattern castilation (shown in FIG. 4) formed on the surfaces of the stack 202 near side 228 can electrically connect the negative conductive pattern 212 to the other negative conductive patterns 212 and the negative contact 216. The positive castilation 230 connects to the positive conductive pattern 214 so that the conductive coatings of the positive pattern castilation (shown in FIG. 4) formed on the surfaces of the stack 202 near side 232 can electrically connect the positive conductive pattern 214 to the other positive conductive patterns 214 and the positive contact 218. The negative conductive pattern 212 does not extend to the peripheral edge of the negative ceramic layer 206 and instead a channel 240 separates and electrically isolates the rest of the negative conductive pattern 212 from the peripheral edge of the negative ceramic layer 206. Preferably, all the negative conductive patterns 212 formed on ceramic layers of the stack 202 have substantially the same shape.

Figure 7:
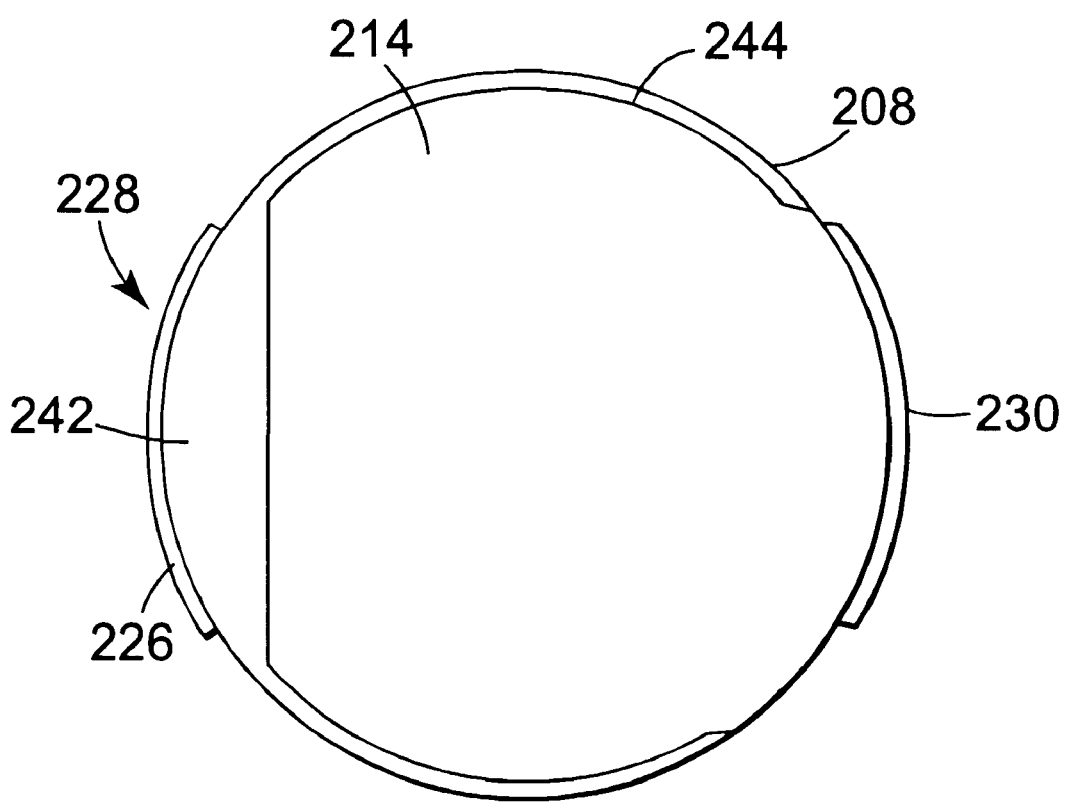
FIG. 7 is a top, plan view of the positive conductive pattern of the multi-layer piezoelectric transducer of FIG. 3.

The positive conductive pattern 214, shown in FIG. 7, is generally circular except for a crescent-shaped cutout portion 242 near the first side edge 228 in which no conductive material is present. The positive castilation 230 connects to the positive conductive pattern 214 so that the conductive coatings of the positive pattern castilation (shown in FIG. 4) formed on the surfaces of the stack 202 near side 232 can electrically connect the positive conductive pattern 214 to the other positive conductive patterns 214 and the positive contact 218. The negative castilation 226 connects to the negative conductive pattern 212 so that the conductive coatings of the negative pattern castilation (shown in FIG. 4) formed on the surfaces of the stack 202 near side 228 can electrically connect the negative conductive pattern 212 to the other negative conductive patterns 212 and the negative contact 216. The positive conductive pattern 214 does not extend to the peripheral edge of the positive ceramic layer 208 and instead a channel 244 separates and electrically isolates the rest of the positive conductive pattern 214 from the peripheral edge of the positive ceramic layer 208. Preferably, the positive conductive patterns 214 formed on ceramic layers of the stack 202 are all substantially the same. Also, it is preferable that the positive conductive patterns 214 are mirror images of, and have substantially the same shape as, the negative conductive patterns 212 so that the bending imparted to the PZT 200 by each of the positive ceramic layers 208 is symmetrical to the bending imparted to the PZT 200 by each of the negative ceramic layers 206.

If the ceramic layer immediately adjacent the bottom ceramic layer 209 is a negative ceramic layer 206 having a negative conductive pattern 212 formed thereon (as shown in FIGS. 3–4), then preferably the bottom ceramic layer 209 has a positive conductive pattern 214 formed on an upper surface thereof so that a voltage can be developed across the immediately adjacent negative ceramic layer 206 when a voltage is developed across the negative and positive contacts 216 and 218. Likewise, if the ceramic layer immediately adjacent the bottom ceramic layer 209 is a positive ceramic layer 208 having a positive conductive pattern 214 formed thereon, then preferably the bottom ceramic layer has a negative conductive pattern 212 formed on an upper surface thereof so that a voltage can be developed across the immediately adjacent positive ceramic layer 208 when a voltage is developed across the negative and positive contacts 216 and 218.

The bottom ceramic layer 209 can be formed as an unpoled ceramic layer (as shown in FIGS. 3–7). The bottom surface 211 of such an unpoled bottom ceramic layer 209 need not have a conductive pattern formed thereon. This allows a better epoxy bond to be formed between the bottom surface 211 of the PZT 200 and the optical device to which the PZT 200 is being attached. But, such an unpoled ceramic layer 209 that does not have a conductive pattern formed on its bottom surface 211 will not apply a bending force to the PZT 200 upon application of a voltage to the negative and positive contacts 216 and 218 and instead will resist the bending force provided by the negative and positive ceramic layers 206 and 208.

Alternatively, the bottom ceramic layer 209 can be formed as a poled ceramic layer. If the poled bottom ceramic layer 209 in such an embodiment has a positive conductive pattern 214 formed on the upper surface thereof, preferably the bottom surface 211 of such a poled bottom ceramic layer 209 would have a negative conductive pattern 212 (connected to the other negative conductive patterns 212) formed thereon so that a voltage can be developed across the bottom ceramic layer 209 during the poling step. Likewise, if the poled bottom ceramic layer 209 has a negative conductive pattern 212 formed on the upper surface thereof, preferably the bottom surface 211 of such a poled bottom ceramic layer 209 would have a positive conductive pattern 214 (connected to the other positive conductive patterns 214) formed thereon so that a voltage can be developed across the bottom ceramic layer 209 during the poling step. In operation, a poled bottom ceramic layer 209 will apply a bending force to the PZT 200 upon application of a voltage to the negative and positive contacts 216 and 218 and will not resist the bending force provided by the negative and positive ceramic layers 206 and 208. However, the epoxy bond that would be formed between the conductive pattern formed on the bottom surface 211 of the bottom ceramic layer 209 and the optical device would be less secure.

The negative and positive ceramic layers 206 and 208 (along with the bottom ceramic layer 209 if the bottom ceramic layer 209 is to be poled) can be poled at the same time by applying an appropriate voltage across the negative castilation 226 (which is in electrical contact with the negative conductive patterns 212) and the positive castilation 230 (which is in electrical contact with the positive conductive patterns 214) in the same manner that the ceramic layers of PZT 100 are poled. Also, as with PZT 100, to improve the bending symmetry of PZT 200, it is preferred that the amount of the top ceramic layer 204 that is poled during the poling step is reduced.

Negative and positive leads from external circuitry such as a regulated voltage source (not shown in FIGS. 3–7) can be connected to the negative and positive contacts 216 and 218, respectively.

The PZT 200 shown in FIGS. 3–7 can be used as a PLC in an optical device such as a RLG. A regulated voltage source and/or other circuitry can be coupled to the contacts 120 and 122 of PZT 100 and the contacts 216 and 218 of PZT 200. Thus, a wireboard element need not be attached to a PZT according to the present invention in order to provide a point at which a regulated voltage source or other circuitry can be coupled to the PZT. The regulated voltage source can be used to apply a voltage to the multi-layer PZT, which turns this voltage into small but precisely controlled mechanical movement in order to maintain a constant light path length in an optical device such as a RLG.

Although the present invention has been described with reference to preferred embodiments, workers skilled in the art will recognize that changes may be made in form and detail without departing from the scope of the invention. For example, the number of layers used and the shape of the final PZT can be varied to suit the particular application for which the PZT is fabricated.

What is claimed is:
1. A multi-layer piezoelectric transducer that can be used as a path length control apparatus of an optical device, comprising:
 a plurality of ceramic layers stacked so as to form a stack, each ceramic layer having first and second opposing surfaces, said plurality of ceramic layers including:
  a top layer at a first end of the stack having a top conductive pattern formed on the first surface thereof that comprises a polarity contact and an opposing polarity contact, wherein the second surface is free of a conductive pattern;
  at least one poled ceramic layer having a polarity conductive pattern formed on the first surface thereof, wherein the polarity conductive pattern substantially covers the first surface and extends to a first side of the first surface, and wherein the second surface is free of a conductive pattern, and the polarity conductive pattern on the first surface contacts the second surface of the ceramic layer adjacent to said layer, wherein said adjacent layer has an opposing polarity conductive pattern on its first surface;
  at least one oppositely poled ceramic layer having an opposing polarity conductive pattern formed on the first surface thereof, wherein the opposing polarity conductive pattern substantially covers the first surface and extends to a second side of the first surface, and wherein the second surface is free of a conductive pattern, wherein the opposing polarity conductive pattern on the first surface contacts the second surface of the ceramic layer adjacent to said layer, wherein said adjacent layer has a polarity conductive pattern on its first surface; and
  a bottom layer at a second end of the stack having a conductive pattern formed on the first surface thereof, wherein the conductive pattern has a polarity that is opposite the polarity of the conductive pattern on the first surface of the adjacent layer, and wherein the conductive pattern on the first surface contacts the second surface of the ceramic layer adjacent to said layer; and
 a first castilation attached to and extending along the first side and onto the first and second ends of the stack and electrically connecting each said polarity conductive pattern and the said polarity contact; and
 a second castilation attached to and extending along the second side and onto the first and second ends of the stack and electrically connecting the opposing polarity conductive pattern and the opposing polarity contact.

2. The multi-layer piezoelectric transducer of claim 1, wherein the polarity is negative and the opposing polarity is positive and the poled ceramic layer is negatively poled and the oppositely poled ceramic layer is positively poled.

3. The multi-layer piezoelectric transducer of claim 1, wherein the plurality of ceramic layers includes a same number of poled ceramic layers as oppositely poled ceramic layers.

4. The multi-layer piezoelectric transducer of claim 1, wherein each polarity conductive pattern has a shape that is substantially symmetrical to the shape of each opposing polarity conductive pattern.

5. The multi-layer piezoelectric transducer of claim 1, wherein the top conductive pattern further comprises a floating portion that is electrically isolated from the negative contact and the positive contact.

6. The multi-layer piezoelectric transducer of claim 5, wherein the top conductive pattern has an isolation channel for electrically isolating the negative contact, the positive contact, and the floating portion from one another.

7. The multi-layer piezoelectric transducer of claim 1, wherein the bottom ceramic layer is unpoled, and wherein the second surface is substantially free of conductive material.

8. The multi-layer piezoelectric transducer of claim 1, wherein the bottom ceramic layer is one of a poled and oppositely poled ceramic layer, wherein said layer has a conductive pattern formed on its second surface that is opposite of the conductive pattern formed on its first surface, and wherein the polarity of the bottom layer is the same polarity as the top layer.

* * * * *